(12) United States Patent
Oka et al.

(10) Patent No.: US 10,600,464 B2
(45) Date of Patent: Mar. 24, 2020

(54) SEMICONDUCTOR STORAGE DEVICE, DRIVING METHOD, AND ELECTRONIC DEVICE

(71) Applicant: SONY CORPORATION, Tokyo (JP)

(72) Inventors: Mikio Oka, Kanagawa (JP); Yasuo Kanda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/094,992

(22) PCT Filed: Apr. 13, 2017

(86) PCT No.: PCT/JP2017/015064
§ 371 (c)(1),
(2) Date: Oct. 19, 2018

(87) PCT Pub. No.: WO2017/187995
PCT Pub. Date: Nov. 2, 2017

(65) Prior Publication Data
US 2019/0147931 A1   May 16, 2019

(30) Foreign Application Priority Data
Apr. 27, 2016 (JP) .................. 2016-088828

(51) Int. Cl.
*G11C 11/16* (2006.01)
*H01L 27/22* (2006.01)
*H01L 43/02* (2006.01)

(52) U.S. Cl.
CPC .......... *G11C 11/1675* (2013.01); *G11C 11/16* (2013.01); *G11C 11/161* (2013.01);
(Continued)

(58) Field of Classification Search
CPC ... G11C 11/1675; G11C 11/16; G11C 11/161; G11C 11/1659; G11C 11/1673; H01L 27/228; H01L 43/02
(Continued)

(56) References Cited

U.S. PATENT DOCUMENTS 6,909,628 B2 * 6/2005 Lin .................. G11C 11/16
365/158
2012/0243303 A1   9/2012 Shuto

FOREIGN PATENT DOCUMENTS

JP    2010-040110    2/2010
JP    2012-203939    10/2012

OTHER PUBLICATIONS

International Search Report prepared by the Japan Patent Office dated May 18, 2017, for International Application No. PCT/JP2017/015064.

* cited by examiner

*Primary Examiner* — Xiaochun L Chen
(74) *Attorney, Agent, or Firm* — Sheridan Ross P.C.

(57) ABSTRACT

The present disclosure relates to a semiconductor storage device, a driving method, and an electronic device capable of suppressing a layout area and improving reliability. A semiconductor storage device is provided with one or more selection transistors, a resistance change element one end of which is connected to a bit line and the other end of which is connected to a drain terminal of a selection transistor, the resistance change element a resistance value of which changes by a current of a predetermined value or larger allowed to flow, and a write control unit connected to a connection point between the selection transistor and the resistance change element and controls the current flowing through the resistance change element when data is written in the resistance change element. The present technology is (Continued)

applicable to, for example, a non-volatile memory provided with a storage element configured by a magnetic tunnel junction.

20 Claims, 10 Drawing Sheets

(52) U.S. Cl.
CPC ...... *G11C 11/1659* (2013.01); *G11C 11/1673* (2013.01); *H01L 27/228* (2013.01); *H01L 43/02* (2013.01)

(58) Field of Classification Search
USPC .......................................................... 365/158
See application file for complete search history.

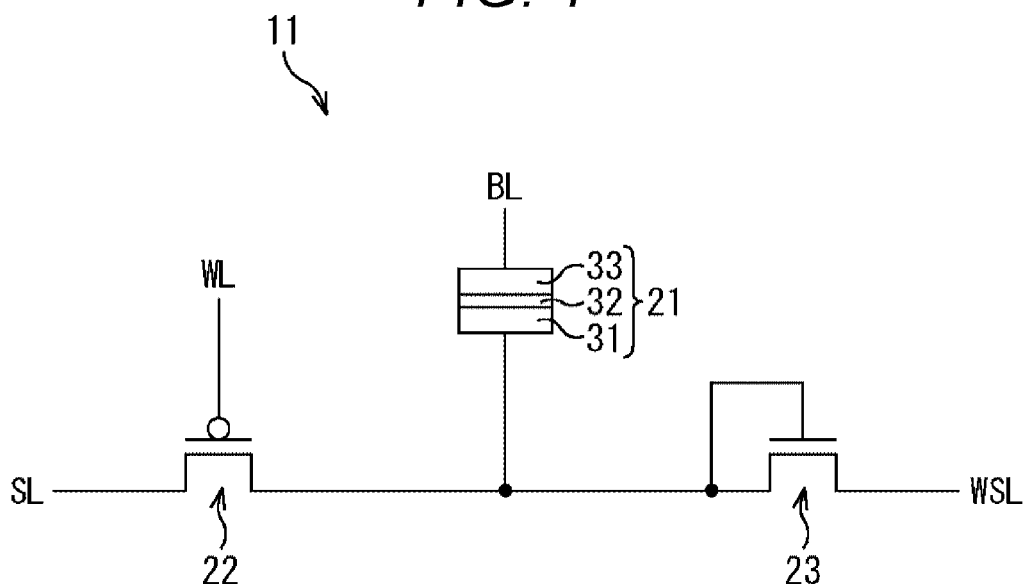
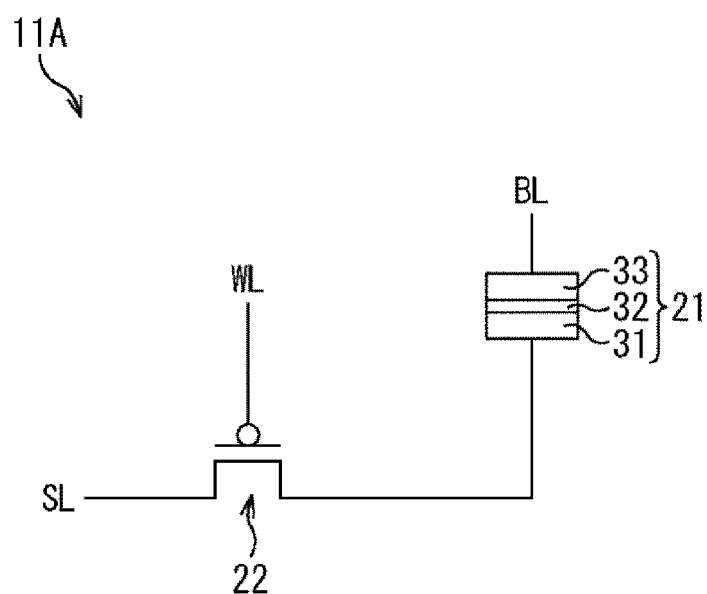

SEMICONDUCTOR STORAGE DEVICE, DRIVING METHOD, AND ELECTRONIC DEVICE

CROSS REFERENCE TO RELATED APPLICATIONS

This application is a national stage application under 35 U.S.C. 371 and claims the benefit of PCT Application No. PCT/JP2017/015064 having an international filing date of 13 Apr. 2017, which designated the United States, which PCT application claimed the benefit of Japanese Patent Application No. 2016-088828 filed 27 Apr. 2016, the entire disclosures of each of which are incorporated herein by reference.

TECHNICAL FIELD

The present disclosure relates to a semiconductor storage device, a driving method, and an electronic device, and especially relates to a semiconductor storage device, a driving method, and an electronic device capable of suppressing a layout area and improving reliability.

BACKGROUND ART

Conventionally, various methods for storing data are developed in a non-volatile memory capable of storing data without power supplied. For example, in a spin transfer torque-magnetic random access memory (STT-MRAM) utilizing a spin injection writing method in which magnetization is reversed by spin transfer torque, data is stored according to a magnetization direction of a magnetic material. Therefore, a non-volatile memory using the STT-MRAM as a storage element may rewrite data at a high speed and rewrite data almost infinite number of times, so that development into a code storage, a working memory and the like is expected.

The storage element of the STT-MRAM is configured by a magnetic tunnel junction (MTJ) in which a tunnel insulating layer is stacked between a magnetic layer in which magnetization is fixed (hereinafter referred to as a fixed layer) and a magnetic layer in which the magnetization is not fixed (hereinafter referred to as a storage layer). In the storage element of the STT-MRAM, data "0" or "1" is read by using a so-called tunnel magnetoresistive effect in which resistance of the magnetic tunnel junction changes depending on the magnetization direction of the fixed layer and the magnetization direction of the storage layer.

For example, when the data is written in the storage element of the STT-MRAM, a certain or larger current is allowed to flow through the magnetic tunnel junction, and the magnetization directions of the fixed layer and the storage layer are changed from a parallel state to an antiparallel state or from the antiparallel state to the parallel state depending on the direction of a write current. At that time, a required write current is larger when changing the magnetization directions of the fixed layer and the storage layer from the parallel state to the antiparallel state.

In addition, a memory cell including a circuit configuration necessary for holding the data in the storage element conventionally includes a selection transistor and a storage element (1-bit MTJ) (refer to FIG. 2 to be described later). For example, one end of the storage element is connected to a bit line, the other end thereof is connected to a drain of the selection transistor, and a source terminal of the selection transistor is connected to a source line. Then, the selection transistor is turned on to control a voltage of the source line or the bit line, and the direction of the write current is changed, so that the data is rewritten in the storage element.

By the way, when the data is written in the memory cell, a memory cell might occur in which a current equal to or larger than a threshold is applied to the storage element due to fluctuation in power supply voltage within a specified range, variation in characteristic of the selection transistor, a change in resistance value due to processing dimension variation of the storage element and the like. In that case, the voltage applied to the storage element might become larger than an element breakdown voltage, and if such voltage is applied, the storage element might be broken, so that there is a fear that reliability is deteriorated.

Therefore, for example, Patent Document 1 proposes the technology of detecting a voltage applied to both ends of a memory cell, and feeding back a detection result to a voltage to be applied to a word line of a selection transistor of the memory cell. As a result, it is possible to control the write current, suppress the breakdown of the storage element, and perform appropriate current control against current shortage at the time of writing.

CITATION LIST

Patent Document

Patent Document 1: Japanese Patent Application Laid-Open No. 2011-138598

SUMMARY OF THE INVENTION

Problems to be Solved by the Invention

However, in the technology disclosed in Patent Document 1, a voltage detection circuit and a write current control circuit are necessary, and it is necessary to finely adjust a voltage applied to the word line in order to perform fine current control, so that a layout area of the circuits becomes large.

The present disclosure is achieved in view of such a situation, and an object thereof is to suppress the layout area and to improve the reliability.

Solutions to Problems

A semiconductor storage device according to one aspect of the present disclosure is provided with at least one or more selection transistors, a resistance change element one end of which is connected to a bit line and the other end of which is connected to a drain terminal of a selection transistor, the resistance change element a resistance value of which changes by a current of a predetermined value or larger allowed to flow, and a write control unit connected to a connection point between the selection transistor and the resistance change element and controls the current flowing through the resistance change element when data is written in the resistance change element.

A driving method according to one aspect of the present disclosure is a driving method of a semiconductor storage device provided with at least one or more selection transistors, a resistance change element one end of which is connected to a bit line and the other end of which is connected to a drain terminal of a selection transistor, the resistance change element a resistance value of which changes by a current of a predetermined value or larger allowed to flow, and a write control unit connected to a connection point between the selection transistor and the resistance change element and controls the current flowing through the resistance change element when data is written in the resistance change element, the driving method provided with making potential of the bit line connected to the resistance element other than a predetermined resistance change element in which the data is to be written floating potential when the data is written in the resistance change element.

An electronic device according to one aspect of the present disclosure is provided with a semiconductor storage device including at least one or more selection transistors, a resistance change element one end of which is connected to a bit line and the other end of which is connected to a drain terminal of a selection transistor, the resistance change element a resistance value of which changes by a current of a predetermined value or larger allowed to flow, and a write control unit connected to a connection point between the selection transistor and the resistance change element and controls the current flowing through the resistance change element when data is written in the resistance change element.

According to one aspect of the present disclosure, at least one or more selection transistors, a resistance change element one end of which is connected to a bit line and the other end of which is connected to a drain terminal of a selection transistor, the resistance change element a resistance value of which changes by a current of a predetermined value or larger allowed to flow, and a write control unit connected to a connection point between the selection transistor and the resistance change element are provided, and the current flowing through the resistance change element when data is written in the resistance change element is controlled by the write control unit.

Effects of the Invention

According to one aspect of the present disclosure, the layout area may be suppressed and the reliability may be improved.

BRIEF DESCRIPTION OF DRAWINGS

FIG. 1 is a circuit diagram illustrating a configuration example of a first embodiment of a memory cell to which the present technology is applied.

FIG. 2 is a circuit diagram illustrating a configuration example of a memory cell of the conventional technology.

MODE FOR CARRYING OUT THE INVENTION

Figure 3:
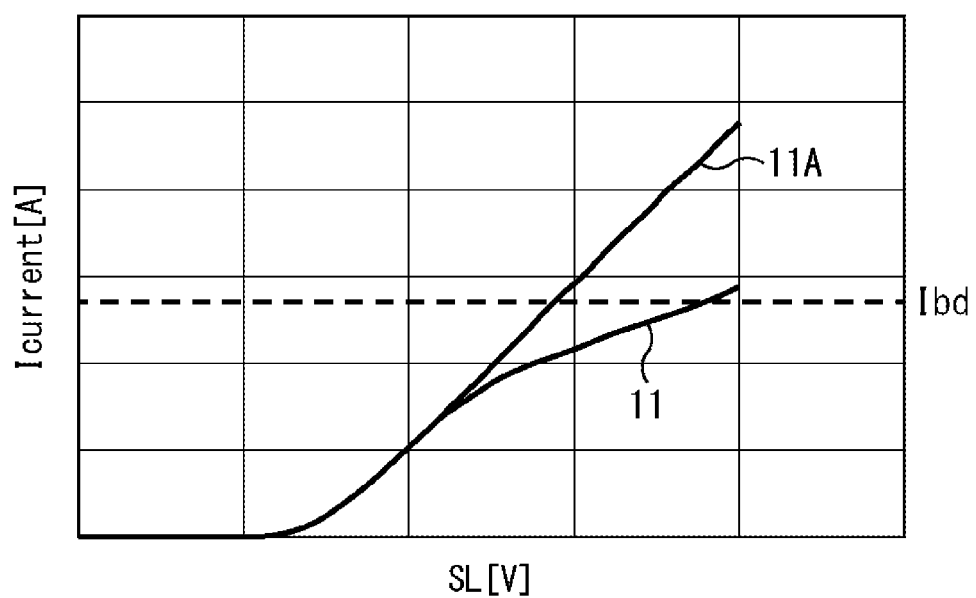
FIG. 3 is a view for illustrating change in current flowing through a storage element.

Hereinafter, a specific embodiment to which the present technology is applied is described in detail with reference to the drawings.

FIG. 1 is a circuit diagram illustrating a configuration example of a first embodiment of a memory cell to which the present technology is applied.

As illustrated in FIG. 1, a memory cell 11 is provided with one storage element 21, one selection transistor 22, and one write control transistor 23.

The storage element 21 is a resistance change element including a magnetic tunnel junction obtained by stacking a fixed layer 31, a tunnel insulating film 32, and a storage layer 33, a resistance value of which changes by a current of a predetermined value or larger allowed to flow through the same. In the configuration example illustrated in FIG. 1, a terminal on a storage layer 33 side of the storage element 21 is connected to a bit line BL, and a terminal on a fixed layer 31 side of the storage element 21 is connected to a drain terminal of the selection transistor 22. In the storage element 21, magnetization of the fixed layer 31 is fixed in a certain direction while magnetization is not fixed in the storage layer 33, and the tunnel insulating film 32 having an insulating property is provided therebetween, so that a tunnel junction is formed. Then, in the storage element 21, data "0" or "1" may be read by using a so-called tunnel magnetoresistance effect in which resistance of the magnetic tunnel junction changes depending on the direction of the magnetization of the fixed layer 31 and that of the storage layer 33.

The selection transistor 22 is a P-type metal oxide semiconductor (MOS) field effect transistor (FET). A source terminal of the selection transistor 22 is connected to a source line SL, the drain terminal of the selection transistor 22 is connected to the storage element 21, and a gate electrode of the selection transistor 22 is connected to a word line WL.

The write control transistor 23 is an N-type MOS FET, and controls the current flowing through the storage element 21 when the data is written in the storage element 21. Meanwhile, as long as the selection transistor 22 and the write control transistor 23 have different polarities, the P-type and the N-type may be reversed. A gate terminal is short-circuited to one of a source terminal and a drain terminal of the write control transistor 23, and the one terminal is connected to a connection point of the storage element 21 and the selection transistor 22. Also, out of the source terminal and the drain terminal of the write control transistor 23, the other terminal not short-circuited to the gate terminal is connected to a write control wiring WSL.

The memory cell 11 is formed in this manner, and at the time of data writing, application of torque to a magnetic layer when spin-polarized electrons passing through the fixed layer 31 enter the storage layer 33 is utilized. Therefore, by allowing a current of a certain threshold or larger to flow through the storage element 21, the direction of the magnetization in the storage layer 33 is reversed, so that the data is written. That is, at the time of writing in the memory cell 11, "0" or "1" is selected by changing polarity of the current allowed to flow through the storage element 21.

Also, as for the threshold current for reversing the magnetization of the storage layer 33, a required write current becomes larger when changing the magnetization directions of the fixed layer 31 and the storage layer 33 from an equilibrium state to a non-equilibrium state. In addition, since this threshold current decreases in proportion to a volume of the storage element 21, scaling becomes possible.

Also, the memory cell 11 is obtained by adding the write control transistor 23 to the memory cell of the conventional structure, so that it is possible to avoid a certain or larger current from flowing through the storage element 21 at the time of data writing. As a result, in the memory cell 11, it is possible to prevent an excessive current such that the storage element 21 is broken from flowing, and reliability may be improved.

Herein, FIG. 2 illustrates a configuration example of a memory cell 11A of the conventional technology.

As illustrated in FIG. 2, the memory cell 11A is provided with one storage element 21 and one selection transistor 22. As is the case with the storage element 21 in FIG. 1, a fixed layer 31, a tunnel insulating film 32, and a storage layer 33 are stacked to form the storage element 21, and the selection transistor 22 is a P-type MOS FET as is the case with the selection transistor 22 in FIG. 1.

Then, as illustrated in FIG. 2, the memory cell 11A has the configuration obtained by removing the write control transistor 23 from the memory cell 11 in FIG. 1. That is, the memory cell 11A is configured such that a terminal on a storage layer 33 side of the storage element 21 is connected to a bit line BL and a terminal on a fixed layer 31 side of the storage element 21 is connected to a drain terminal of the selection transistor 22. Also, a source terminal of the selection transistor 22 is connected to a source line SL, and a gate electrode of the selection transistor 22 is connected to a word line WL.

With reference to FIG. 3, change in the current flowing through the storage element 21 in the memory cell 11 to which the present technology is applied and the memory cell 11A in the conventional technology is described.

FIG. 3 illustrates a result of circuit simulation when the current is allowed to flow from the fixed layer 31 to the storage layer 33 in the storage element 21 of the memory cell 11 illustrated in FIG. 1 and the memory cell 11A illustrated in FIG. 2. In FIG. 3, the abscissa represents potential [V] of the source line SL, and the ordinate represents the current [A] flowing through the storage element 21.

For example, the circuit simulation was performed under the following conditions. The potential of the word line WL, the bit line BL, and the write control wiring WSL was set to 0V and the potential of the source line SL was changed from 0V to a power supply voltage VDD. In addition, a base bias of the selection transistor 22 was set to the power supply voltage VDD, a substrate bias of the write control transistor 23 was set to 0V, and temperature was set to 25 degrees C.

As illustrated in FIG. 3, as the potential of the source line SL increases, the current flowing through the storage element 21 of the memory cell 11 and the memory cell 11A increases. Then, while a gradient of an increase in the current flowing through the storage element 21 is substantially constant in the memory cell 11A, a gradient of an increase in the current flowing through the storage element 21 gradually changes in the memory cell 11. That is, in the memory cell 11, when a certain or larger current flows through the storage element 21, the write control transistor 23 is turned on, and the current flows through the write control wiring WSL. As a result, as compared to the memory cell 11A, in the memory cell 11, it is avoided that an excessive current flows through the storage element 21, for example, that a current which significantly exceeds a specified current value Ibd flows through the storage element 21 even if the potential of the source line SL increases.

Therefore, in the memory cell 11, it is possible to suppress the excessive current from flowing through the storage element 21 due to variation in the power supply voltage, variation in characteristic of the selection transistor 22, or the like, or variation in resistance value of the storage element 21 by the configuration obtained by adding the write control transistor 23. As a result, in the memory cell 11, it is possible to prevent occurrence of element breakdown of the storage element 21, thereby improving reliability as compared to the conventional case.

Figure 4:
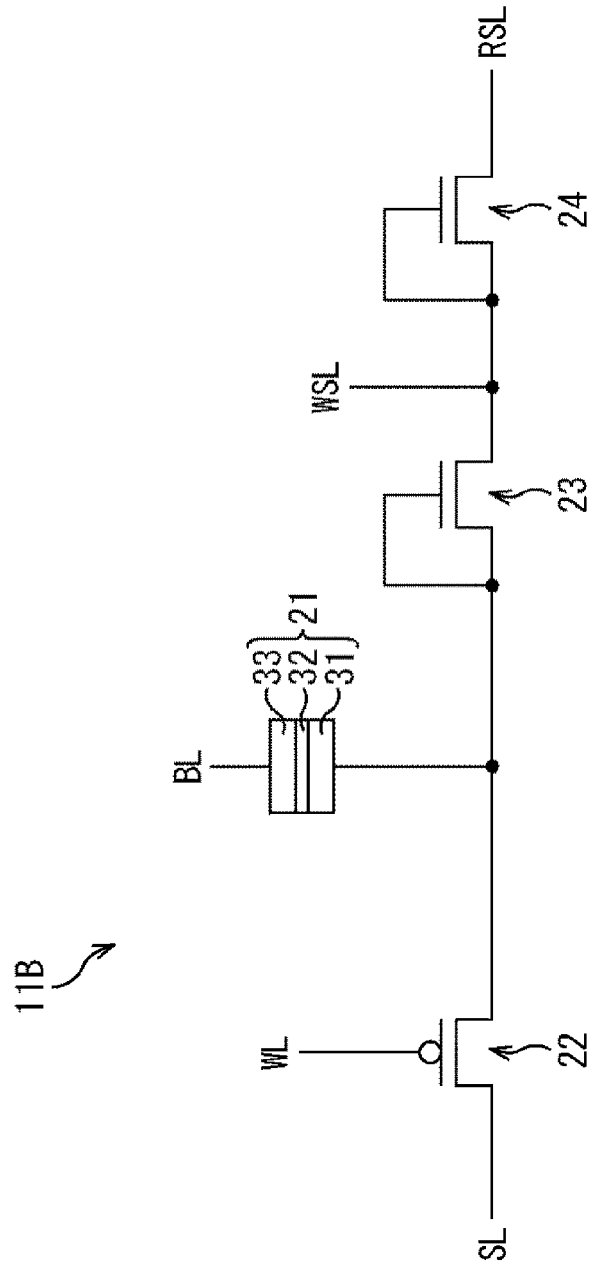
FIG. 4 is a circuit diagram illustrating a configuration example of a second embodiment of a memory cell to which the present technology is applied.

Next, FIG. 4 is a circuit diagram illustrating a configuration example of a second embodiment of a memory cell to which the present technology is applied. Meanwhile, in a memory cell 11B illustrated in FIG. 4, the same reference sign is given to a configuration common to that of the memory cell 11 in FIG. 1, and the detailed description thereof is not repeated.

That is, as illustrated in FIG. 4, the memory cell 11B has a configuration common to that of the memory cell 11 in FIG. 1 in including a storage element 21, a selection transistor 22, and a write control transistor 23. On the other hand, the memory cell 11B has a configuration different from that of the memory cell 11 in FIG. 1 in including a read control transistor 24.

As the write control transistor 23, the read control transistor 24 is an N-type MOS FET. A gate terminal is short-circuited to one of a source terminal and a drain terminal of the read control transistor 24, and the one terminal is connected to a write control wiring WSL together with a terminal which is not short-circuited to a gate terminal of the write control transistor 23. Also, out of the source terminal and the drain terminal of the read control transistor 24, the other terminal not short-circuited to the gate terminal is connected to a read control wiring RSL.

As is the case with the memory cell 11 in FIG. 1, the memory cell 11B configured as described above may improve reliability. Furthermore, in the memory cell 11B, occurrence of erroneous writing may be prevented as compared with the conventional case.

Figure 5:
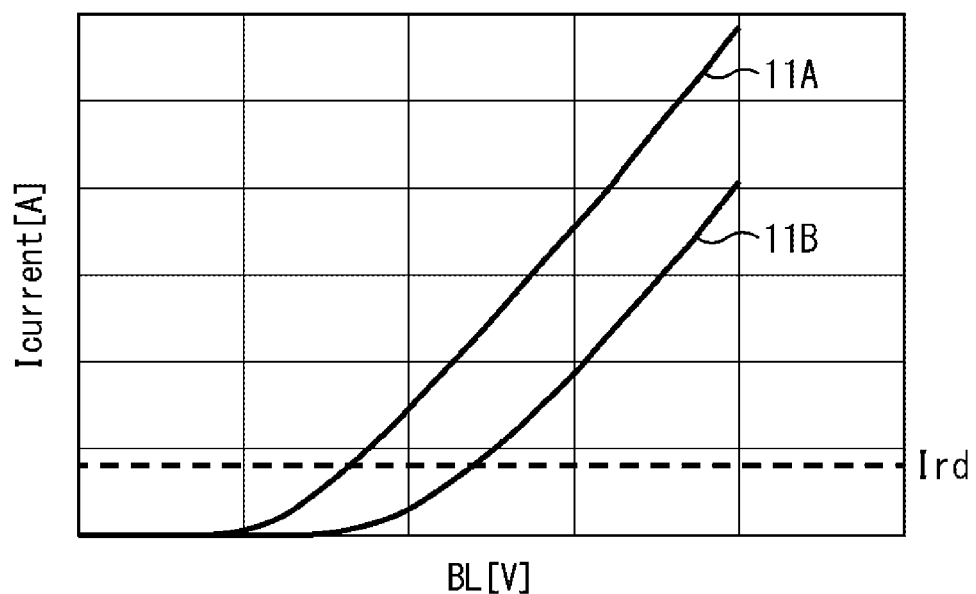
FIG. 5 is a view for illustrating change in current flowing through a storage element.

With reference to FIG. 5, change in current flowing through the storage element 21 in the memory cell 11B to which the present technology is applied and the memory cell 11A in the conventional technology (FIG. 2) is described.

FIG. 5 illustrates a result of circuit simulation when allowing the current to flow from a storage layer 33 to a fixed layer 31 of the storage element 21 to read a resistance value of the storage element 21 in the storage element 21 of the memory cell 11B illustrated in FIG. 4 and the memory cell 11A illustrated in FIG. 2. In FIG. 5, the abscissa represents potential [V] of the bit line BL, and the ordinate represents the current [A] flowing through the storage element 21. FIG. 5 also illustrates a current amount Ird for preventing the erroneous writing at the time of reading.

For example, the circuit simulation was performed under the following conditions. The potential of the word line WL of the memory cell 11A was set to 0V, the potential of the word line WL of the memory cell 11B was set to the power supply voltage VDD, and the potential of the bit line BL was changed from 0 V to the power supply voltage VDD. In addition, the potential of the write control wiring WSL was set to 0V, the potential of the write control wiring WSL was set to floating potential, and the potential of the read control wiring RSL was set to 0 V. In addition, a base bias of the selection transistor 22 was set to the power supply voltage VDD, a substrate bias of the write control transistor 23 was set to 0V, and temperature was set to 25 degrees C.

As illustrated in FIG. 5, as the potential of the bit line BL increases, the current flowing through the storage element 21 of the memory cell 11 and the memory cell 11A increases. It is illustrated that the current flowing through the storage element 21 decreases with respect to the potential of the bit line BL in the memory cell 11B as compared to the memory cell 11A.

That is, in the memory cell 11B, transistor resistance increases due to a source follower effect of the read control transistor 24 by the configuration obtained by adding the read control transistor 24. As a result, even if an excessive read voltage is applied to the memory cell 11B, the memory cell 11B may suppress the current flowing through the storage element 21, so that the occurrence of the erroneous writing may be prevented. Also, in the memory cell 11B, since series resistance increases by the source follower, the voltage at the time of reading may be set to the power supply voltage VDD.

Figure 6:
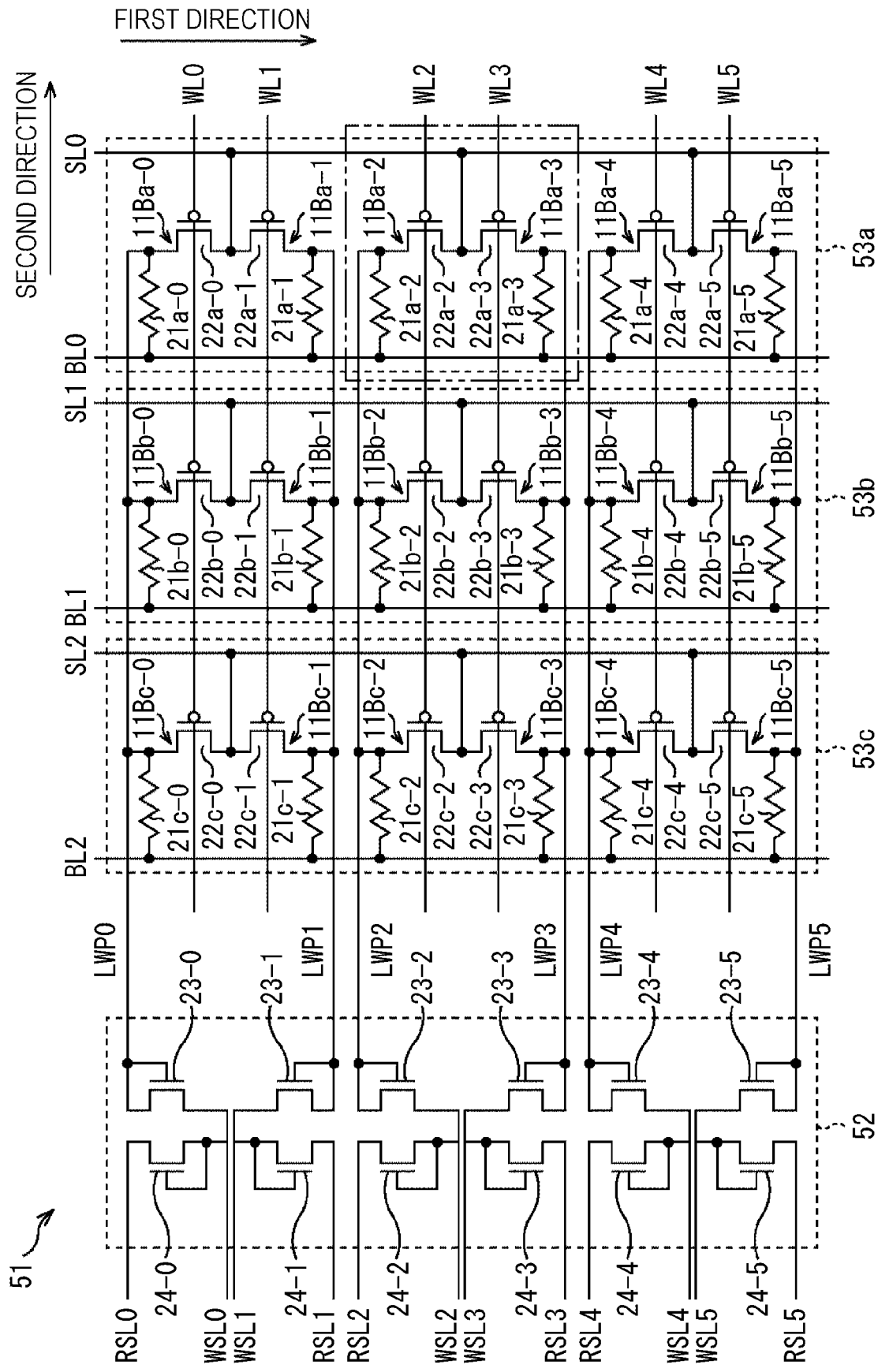
FIG. 6 is a circuit diagram illustrating a configuration example of a memory array.

Next, FIG. 6 illustrates a configuration example of a memory array in which the memory cells 11B in FIG. 4 are arranged in an array.

In the configuration example of a memory array 51 illustrated in FIG. 6, 18 memory cells 11B are arranged in an array such that six memory cells 11B are arranged in a first direction and three memory cells 11B are arranged in a second direction. In addition, for each row of a plurality of memory cells 11B arranged in the second direction, the write control transistor 23 and the read control transistor 24 are shared.

For example, the memory array 51 includes a peripheral circuit unit 52 extending in the first direction and a plurality of column units 53 (three column units 53a to 53c in the example in FIG. 6) extending in the first direction and arranged side by side in the second direction.

The peripheral circuit unit 52 is arranged in an end portion (left end portion in the example in FIG. 6) of the memory array 51 in which the write control transistors 23 and the read control transistors 24 forming the memory cell 11B are repeatedly arranged in the first direction. In the configuration example illustrated in FIG. 6, six write control transistors 23-0 to 23-5 and six read control transistors 24-0 to 24-5 are repeatedly arranged in the first direction in the peripheral circuit unit 52.

Then, the write control transistor 23-0 and the read control transistor 24-0 are shared by memory cells 11Ba-0 to 11Bc-0. Also, the write control transistor 23-1 and the read control transistor 24-1 are shared by memory cells 11Ba-1 to 11Bc-1. Hereinafter, similarly, the write control transistor 23-5 and the read control transistor 24-5 are shared by memory cells 11Ba-5 to 11Bc-5.

In each of the write control transistors 23-0 to 23-5, the gate terminal is short-circuited to one of the source terminal and the drain terminal, and the other terminal not short-circuited to the gate terminal is connected the write control wiring WSL of the write control transistor 23 and the read control transistor 24.

In each of the read control transistors 24-0 to 24-5, the gate terminal is short-circuited to one of the source terminal and the drain terminal, and the other terminal not short-circuited to the gate terminal is connected the read control wiring RSL together with the read control transistor 24.

The storage elements 21 and the selection transistors 22 forming the memory cell 11B are repeatedly arranged in the first direction to form the column unit 53. In the configuration example illustrated in FIG. 6, six write storage elements 21-0 to 21-5 and six selection transistors 22-0 to 22-5 are repeatedly arranged in the first direction in the column unit 53.

For example, in the column unit 53a, storage elements 21a-0 to 21a-5 and selection transistors 22a-0 to 22a-6 are repeatedly arranged in the first direction. Similarly, in the column unit 53b, storage elements 21b-0 to 21b-5 and selection transistors 22b-0 to 22b-6 are repeatedly arranged in the first direction, and in the column unit 53c, storage elements 21c-0 to 21c-5 and selection transistors 22c-0 to 22c-6 are repeatedly arranged in the first direction.

In addition, word lines WL0 to WL5 are arranged so as to extend in the second direction. The word line WL0 is connected to the gate electrodes of the selection transistors 22a-0 to 22c-0 of a first row, and the word line WL1 is connected to the gate electrodes of the selection transistors 22a-1 to 22c-1 of a second row. Hereinafter, similarly, the word lines WL2 to WL5 are connected to the selection transistors 22 of the corresponding rows, respectively.

Also, in the memory array 51, connection wirings LWP0 to LWP5 connecting the peripheral circuit unit 52 to the column units 53a to 53c extend in the second direction as is the case with the word lines WL0 to WL5. The connection wiring LWP0 connects the write control transistor 23-0 in the first row to the selection transistors 22a-0 to 22c-0, and the connection wiring LWP1 connects the write control transistor 23-1 in the second row to the selection transistors 22a-1 to 22c-1. Hereinafter, similarly, the connection wirings LWP2 to LWP5 connect the control transistors 23 to the selection transistors 22 of the corresponding rows, respectively.

The memory array 51 is configured in this manner, and one pair of the write control transistor 23 and the read control transistor 24 is provided for one word line WL and arranged in a peripheral portion of the memory array 51. Then, by sharing the write control transistor 23 and the read control transistor 24 by the storage elements 21 and the selection transistors 22 of each row, an area of the memory array 51 is prevented from increasing and a layout area may be suppressed.

Meanwhile, although the memory array 51 in which the memory cells 11B in FIG. 4 are arranged in an array is illustrated in FIG. 6, a similar effect may be obtained also in a memory array in which the memory cells 11 in FIG. 1 are arranged in an array. In the memory array in which the memory cells 11 are arranged in an array, the write control transistor 23 is shared by a plurality of selection transistors 22 and storage elements 21 arranged in a certain row.

Next, a structure of the memory cell 11B is described with reference to FIGS. 7 and 8.

Figure 7:
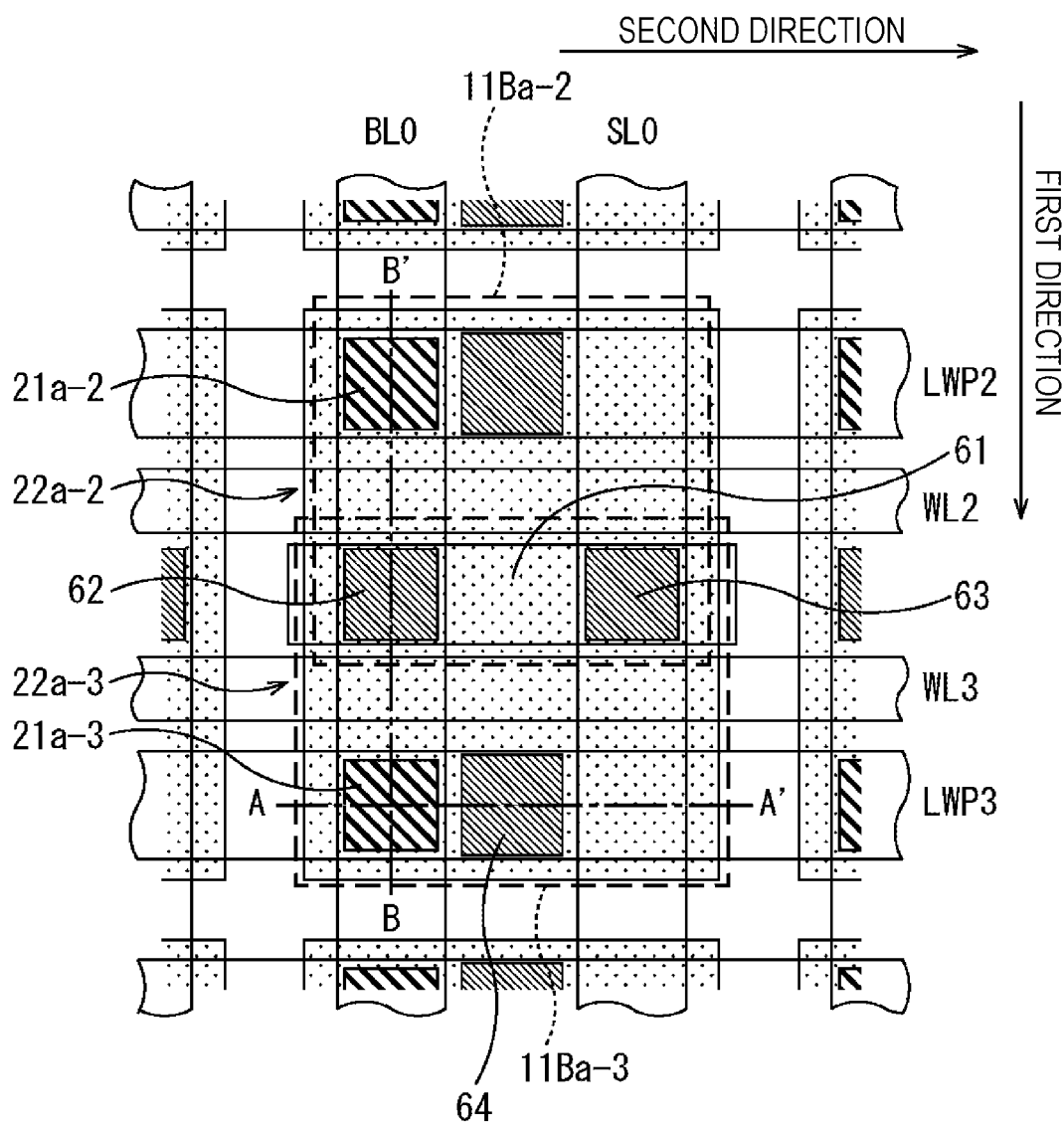
FIG. 7 is a view illustrating a planar layout of the memory cell.

FIG. 7 illustrates a planar layout of the memory cells 11Ba-2 and 11Ba-3 arranged in a region enclosed by dashed-two dotted line in FIG. 6. A of FIG. 8 illustrates a cross-sectional structure taken along dashed-dotted line A-A' illustrated in FIG. 7, and B of FIG. 8 illustrates a cross-sectional structure taken along dashed-dotted line B-B' illustrated in FIG. 7.

As illustrated in FIG. 7, as seen in a plan view, a bit line BL0 and a source line SL0 are provided so as to extend in the first direction, and the word lines WL2 and WL3 are provided so as to extend in the second direction orthogonal to the first direction. Then, diffusion layers 61 serving as element regions (active regions) are formed at regular intervals in the first direction and the second direction.

The selection transistor 22a-2 is provided in a position where the word line WL2 passes through the diffusion layer 61, and the selection transistor 22a-3 is provided in a position where the word line WL3 passes through the diffusion layer 61. As illustrated, the memory cell 11Ba-2 and the memory cell 11Ba-3 are adjacent to each other, and the source terminal is shared by the selection transistor 22a-2 of the memory cell 11Ba-2 and the selection transistor 22a-3 of the memory cell 11Ba-3. Then, the source terminal is connected to the source line SL0 via a contact 62 and a via 63.

The storage element 21a-3 is arranged in a position where the connection wiring LWP3 intersects with the bit line BL0 and connects the connection wiring LWP3 to the bit line BL0 with the connection wiring LWP3 as a lower electrode and the bit line BL0 as an upper electrode. The storage element 21a-3 is connected to the drain terminal of the selection transistor 22a-3 via a contact 64 connected to the connection wiring LWP3.

In addition, the connection wiring LWP arranged so as to be parallel to the word line WL to connect a plurality of memory cells 11B is connected to the write control transistor 23 arranged in the peripheral circuit unit 52.

Figure 8:
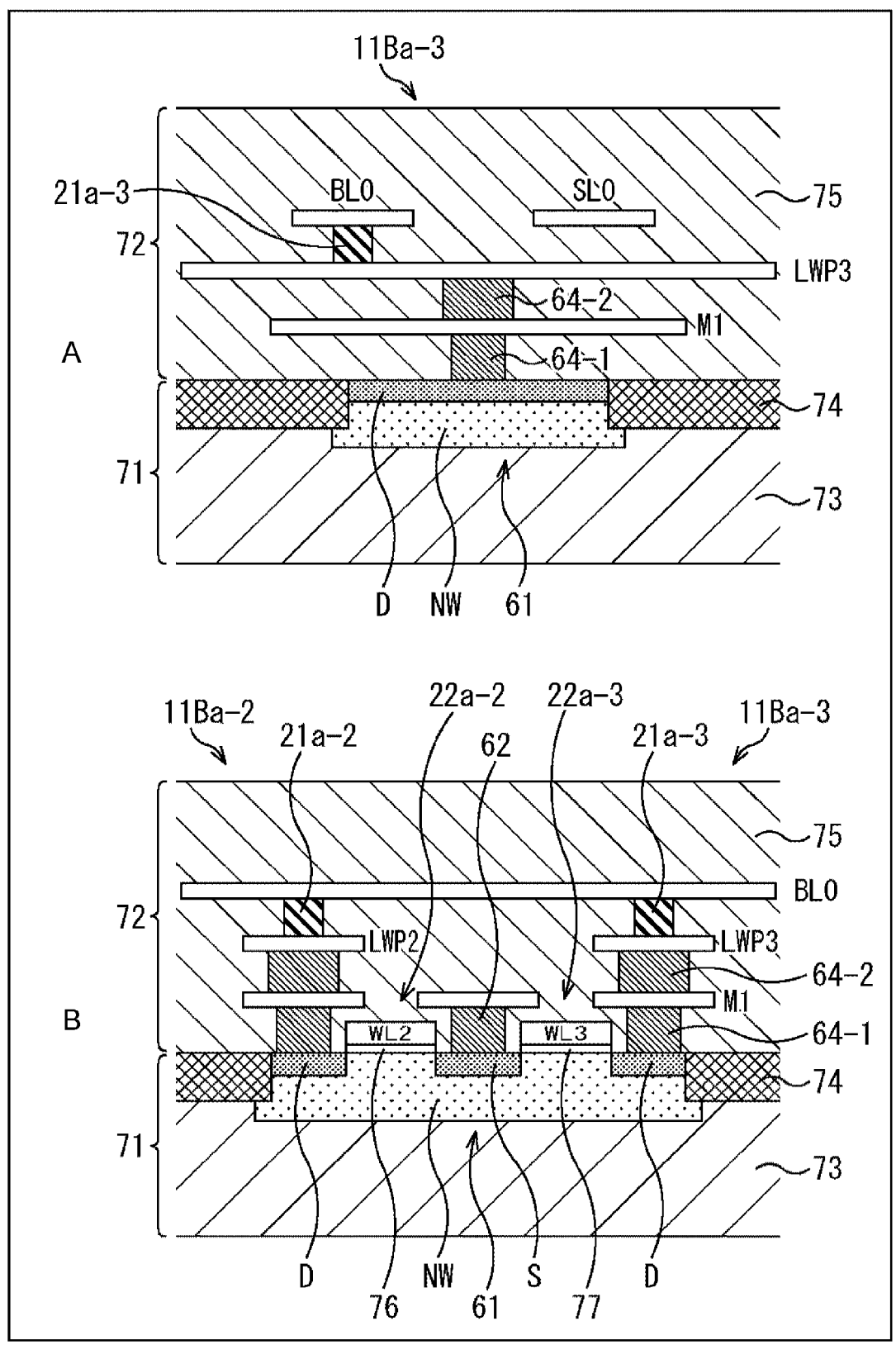
FIG. 8 is a view illustrating a cross-sectional structure of the memory cell.

As illustrated in FIG. 8, the memory cells 11Ba-2 and 11Ba-3 are formed on a substrate obtained by stacking a wiring layer 72 on a substrate layer 71.

The diffusion layer 61 serving as the element region (active region) is formed in a region where an element isolation region 74 is not provided out of a surface region within a P-type semiconductor substrate 73 forming the substrate layer 71. Also, in the wiring layer 72, a plurality of layers of wirings is arranged in a state insulated by an interlayer insulating film 75.

As illustrated in A of FIG. 8, in the diffusion layer 61, a drain region D is formed on an upper layer and an N-type well NW is formed on a lower layer. A contact 64-1 formed immediately above the drain region D connects the drain region D to an upper layer wiring M1 and a plug contact 64-2 is formed so as to connect the upper layer wiring M1 to the connection wiring LWP3. A connection configuration is such that the connection wiring LWP3 serves as the lower electrode of the storage element 21a-3 and the bit line BL0 serves as the lower electrode of the storage element 21a-3, and the storage element 21a-3 is connected between the bit line BL0 and the drain region D of the selection transistor 22a-3.

Also, the source line SL0 connected to the selection transistor 22a-3 is arranged at a constant interval so as to be parallel to the bit line BL0. In addition, the connection wiring LWP3 serving as the lower electrode is arranged at a constant interval so as to be parallel to the word line WL and is connected to the write control transistor 23 arranged in the peripheral circuit unit 52 as illustrated with reference to FIG. 6.

As illustrated in B of FIG. 8, in the diffusion layer 61, a source region S and the drain region D of the selection transistor 22a-2 are formed so as to interpose the word line WL2 therebetween, and the source region S and the drain region D of the selection transistor 22a-3 are formed so as to interpose the word line WL3. At that time, as described above, the source region S is shared by the selection transistor 22a-2 and the selection transistor 22a-3. Also, a gate oxide film 76 is formed immediately under the word line WL2, a gate oxide film 77 is formed immediately under the word line WL3, and the N-type well NW is formed under them.

The source region S shared by the selection transistors 22a-2 and 22a-3 is connected to the upper layer wiring M1 via the contact 62 and is connected to the source line SL0 via the via 63 as illustrated in FIG. 7. The drain region D of the selection transistor 22a-3 is connected to the upper layer wiring M1 via the contact 64-1, and the upper layer wiring M1 is connected to the connection wiring LWP3 via the plug contact 64-2. The connection wiring LWP3 serves as the lower electrode of the storage element 21a-3, and the storage element 21a-3 is connected to the bit line BL0 serving as the upper electrode.

The memory array 51 is configured as described with reference to FIGS. 6 to 8, and the connection wiring LWP serving as the lower electrode of the storage element 21 is connected to the write control transistor 23 and the read control transistor 24 arranged in the peripheral circuit unit 52, so that it is possible to suppress the excessive current from flowing through the storage element 21.

Next, access operation on the storage element 21 of the memory array 51 is described with reference to FIGS. 9 and 10. Meanwhile, only write operation is herein described.

Figure 9:
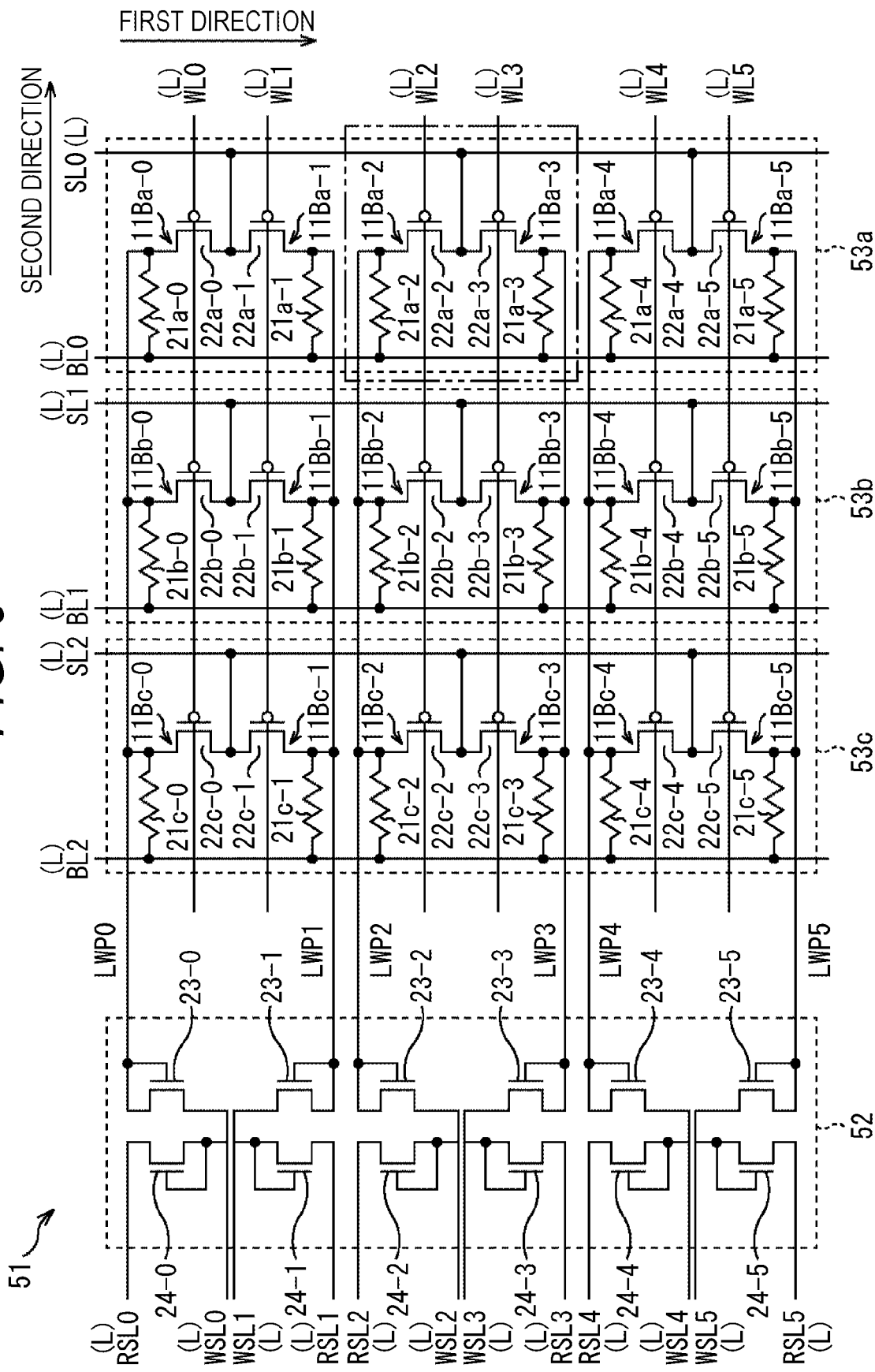
FIG. 9 is a view illustrating an example of an applied voltage when the memory array is in a stand-by state.

FIG. 9 illustrates an applied voltage in a stand-by state in which writing in the memory array 51 is waited. As illustrated in FIG. 9, in the stand-by state, a low level (L) voltage is applied to all of the word line WL, the bit line BL, the source line SL, the write control wiring WSL, and the read control wiring RSL.

Figure 10:
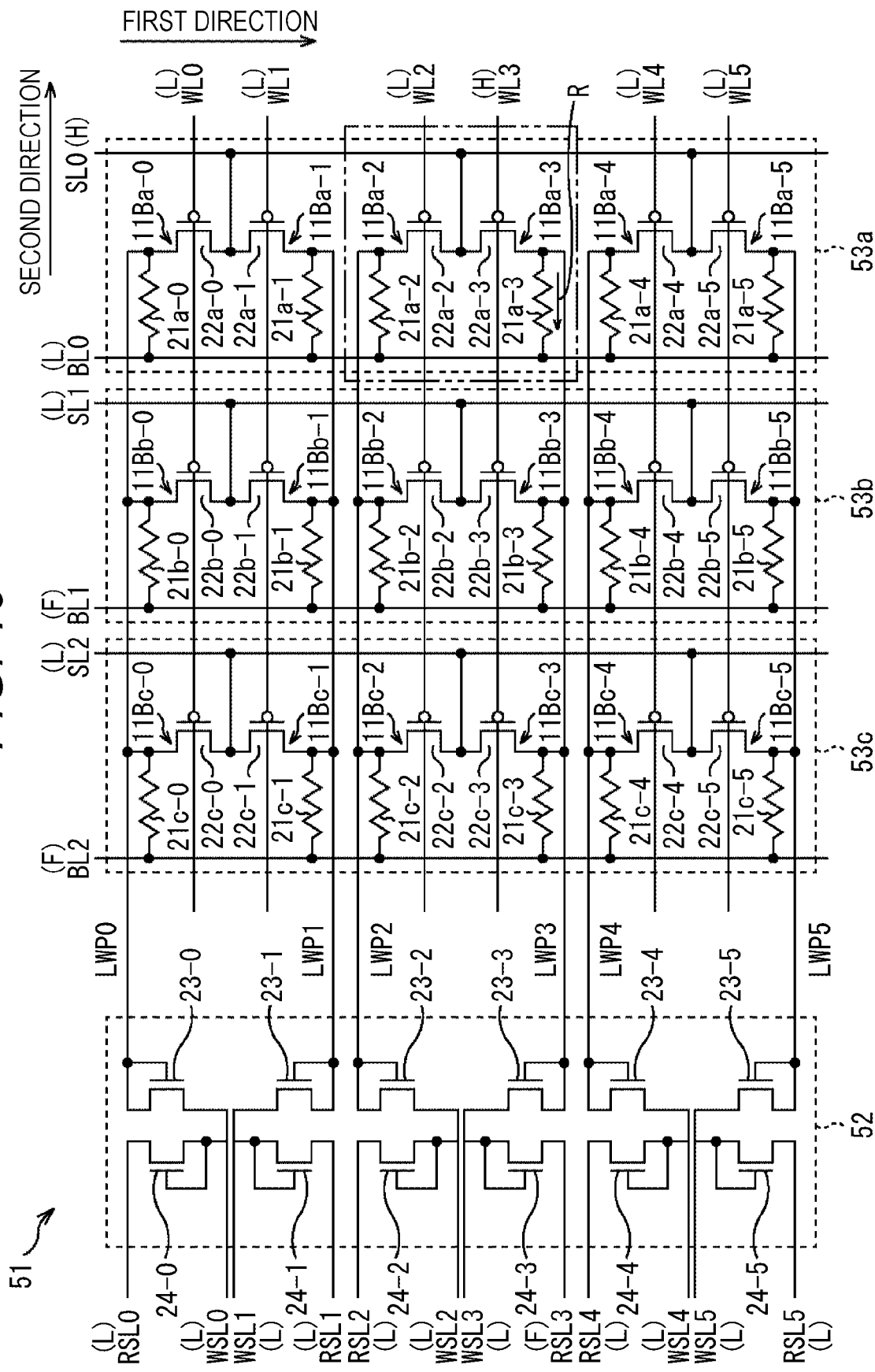
FIG. 10 is a view illustrating an example of an applied voltage when data is written in the storage element.

FIG. 10 illustrates an operation example when the data "1" is written in the storage element 21a-3. In order to write the data "1" in the storage element 21a-3, it is necessary to flow the current from the source line SL0 to the bit line BL0.

Therefore, as illustrated in FIG. 10, a high level (H) voltage higher than the low level (L) is applied to the source line SL0. Then, the bit line BL0 is maintained at the low level (L) and potential of the bit lines BL1 and BL2 is set to floating potential (F). That is, in the memory array 51, the potential of the bit line BL connected to the storage element 21 other than the storage element 21a-3 in which the data is to be written is made the floating potential. On the other hand, the high level (H) is applied to the word line WL3, and the other word lines WL0, WL1, WL2, WL3, and WL5 are maintained at the low level (L).

At that time, a low level (L) is applied to the write control wiring WSL3 and the potential of the read control wiring RSL3 is set to the floating potential (F). In addition, the other write control wirings WSL0, WSL1, WSL2, WSL4, and WSL5 and the read control wirings RSL0, RSL1, RSL2, RSL4, and RSL05 are maintained at the low level (L).

By setting such voltage, the current flows only through the storage element 21a-3 in a direction of arrow R1 illustrated in FIG. 10, and the resistance value of the storage element 21a-3 changes to a high resistance state, so that the data "1" may be written in the storage element 21a-3. Also, at that time, in a case where an overcurrent enough for breaking the storage element 21a-3 flows, the write control transistor 23-3 is turned on, and a certain or larger current is released to the write control wiring WSL3, so that it becomes possible to prevent the element breakdown of the storage element 21a-3.

As described above, according to the memory cell 11 to which the present technology is applied, by releasing the excessive write current to the write control transistor 23, it is possible to suppress the erroneous writing and enlarge a storage element breakdown margin. In addition, in the memory cell 11B obtained by adding the read control transistor 24 to the write control transistor 23, the power supply voltage of the bit line BL and the source line SL at the time of reading may be easily controlled. As a result, in the memory cell 11B, since an internal power supply is not necessary and external power supply may be used, a memory macro size may be reduced.

Furthermore, in the memory array 51, the write control transistor 23 and the read control transistor 24 may be arranged in the peripheral circuit unit 52 outside the memory cell array. Furthermore, in the memory array 51, the write control transistor 23 and the read control transistor 24 may be shared for each word line WL. Therefore, it is possible to prevent an increase in the area of the memory cell.

Furthermore, in the memory cells 11 and 11B, it becomes possible to prevent the excessive current from being applied to the storage element 21, so that it becomes possible to improve the number of times of endurance (rewriting) of the memory cell.

Meanwhile, the configuration example in which the memory cells 11 and 11B are provided with one selection transistor 22 is described in this embodiment; however, for example, a configuration in which two or more selection transistors 22 are provided may also be adopted. Also, the storage element 21 is not limited to the STT-MRAM as described above, but may be a resistance change element such as a resistive random access memory (ReRAM), for example.

Also, a non-volatile memory using the memory cells 11 and 11B as described above may be applied to various electronic devices.

Figure 11:
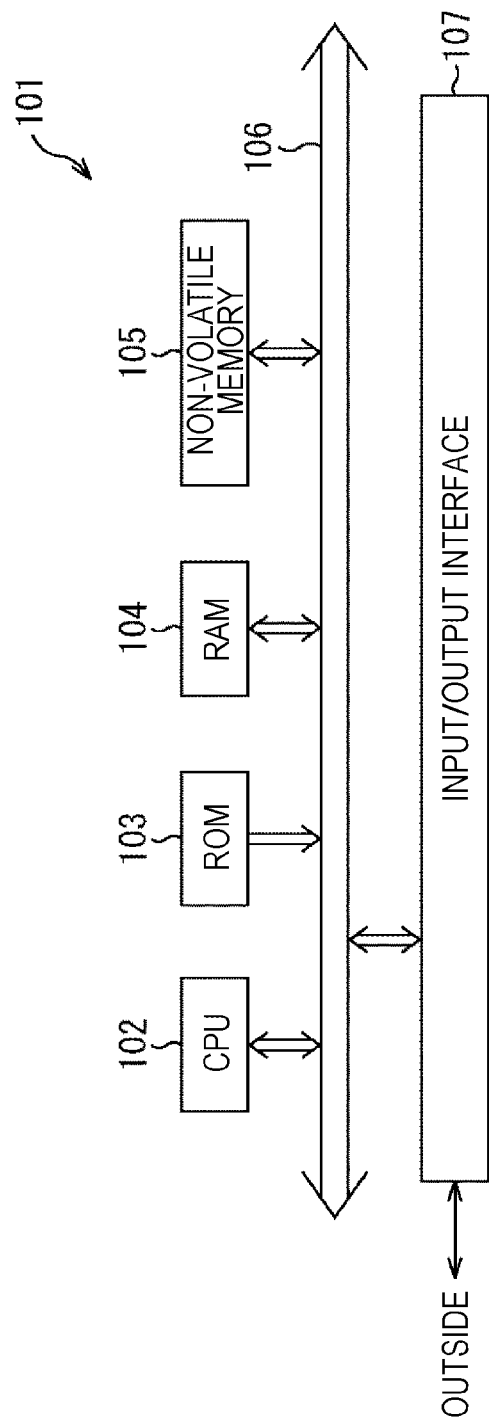
FIG. 11 is a block diagram illustrating a configuration example of one embodiment of an electronic device to which the present technology is applied.

FIG. 11 is a block diagram illustrating a configuration example of an electronic device provided with a non-volatile memory to which the present technology is applied.

In an electronic device 101, a central processing unit (CPU) 102, a read only memory (ROM) 103, a random-access memory (RAM) 104, and a non-volatile memory 105 are connected to one another by a bus 106. Furthermore, an input/output interface 107 is connected to the bus 106, and the input/output interface 107 is connected to the outside. In the electronic device 101 configured in the above-described manner, the CPU 102 loads a program stored in the ROM 103 and the non-volatile memory 105, for example, on the RAM 104 through the bus 106 to execute, so that various processes may be executed.

By using the above-described memory cell 11 as the non-volatile memory 105 of the electronic device 101, for example, the electronic device 101 may be made smaller than the conventional one and reliability thereof may be improved.

(1)
A semiconductor storage device provided with:
at least one or more selection transistors;
a resistance change element one end of which is connected to a bit line and the other end of which is connected to a drain terminal of a selection transistor, the resistance change element a resistance value of which changes by a current of a predetermined value or larger allowed to flow; and
a write control unit connected to a connection point between the selection transistor and the resistance change element and controls the current flowing through the resistance change element when data is written in the resistance change element.

(2)
The semiconductor storage device according to (1) described above,
in which the write control unit is a transistor a gate terminal of which is short-circuited to one of a source terminal and a drain terminal, the one terminal is connected to the connection point between the selection transistor and the resistance change element, and the other terminal is connected to a write control wiring.

(3)
The semiconductor storage device according to (2) described above,
in which the selection transistor and the write control transistor have polarities different from each other.

(4)
The semiconductor storage device according to any one of (1) to (3) described above, further provided with:
a read control unit connected to the resistance change element via the write control unit and controls the current flowing through the resistance change element when data is read from the resistance change element.

(5)
The semiconductor storage device according to (4) described above,
in which the write control unit is a transistor a gate terminal of which is short-circuited to one of a source terminal and a drain terminal, the one terminal is connected to the connection point between the selection transistor and the resistance change element, and the other terminal is connected to a write control wiring, and
the read control unit is a read control transistor a gate terminal of which is short-circuited to one of a source terminal and a drain terminal, the one terminal is connected to a connection point between the write control transistor and the write control wiring, and the other terminal is connected to a read control wiring.

(6)
The semiconductor storage device according to (5) described above,
in which the selection transistor and the read control transistor have polarities different from each other.

(7)
The semiconductor storage device according to any one of (1) to (6) described above, in which the resistance change element has a stacked structure in which a tunnel insulating film having an insulating property is provided between a fixed layer in which magnetization is fixed in a certain direction and a storage layer in which magnetization is not fixed.

(8)
The semiconductor storage device according to any one of (1) to (7) described above,
in which the write control unit is shared by a plurality of selection transistors and resistance change elements arranged in a certain row in a memory array in which memory cells each including the selection transistor, the resistance change element, and the write control unit are arranged in an array.

(9)
The semiconductor storage device according to any one of (4) to (7) described above,
in which the write control unit and the read control unit are shared by a plurality of selection transistors and resistance change elements arranged in a certain row in a memory array in which memory cells each including the selection transistor, the resistance change element, the write control unit, and the read control unit are arranged in an array.

(10)
The semiconductor storage device according to any one of (1) to (9) described above,
in which potential of the bit line connected to the resistance change element other than a predetermined resistance change element in which data is to be written is set to floating potential when the data is written in the resistance change element.

(11)
A driving method of a semiconductor storage device provided with:
at least one or more selection transistors;
a resistance change element one end of which is connected to a bit line and the other end of which is connected to a drain terminal of a selection transistor, the resistance change element a resistance value of which changes by a current of a predetermined value or larger allowed to flow; and
a write control unit connected to a connection point between the selection transistor and the resistance change element and controls the current flowing through the resistance change element when data is written in the resistance change element,
the driving method provided with:
making potential of the bit line connected to the resistance element other than a predetermined resistance change element in which the data is to be written floating potential when the data is written in the resistance change element.

(12)
An electronic device provided with:
a semiconductor storage device including:
at least one or more selection transistors;
a resistance change element one end of which is connected to a bit line and the other end of which is connected to a drain terminal of a selection transistor, the resistance change element a resistance value of which changes by a current of a predetermined value or larger allowed to flow; and
a write control unit connected to a connection point between the selection transistor and the resistance change element and controls the current flowing through the resistance change element when data is written in the resistance change element.

Meanwhile, this embodiment is not limited to the above-described embodiment and may be variously changed without departing from the gist of the present disclosure.

REFERENCE SIGNS LIST

11 Memory cell
21 Storage element
22 Selection transistor
23 Write control transistor
24 Read control transistor
31 Fixed layer
32 Tunnel insulating film
33 Storage layer
51 Memory array
52 Peripheral circuit unit
53 Column unit
61 Diffusion layer
62 Contact
63 Via
64 Contact
71 Substrate layer
72 Wiring layer
73 P-type semiconductor substrate
74 Element isolation region
75 Interlayer insulating film
76, 77 Gate oxide film

What is claimed is:

1. A semiconductor storage device, comprising:
at least one or more selection transistors;
a resistance change element, wherein one end of the resistance change element is connected to a bit line and the other end of the resistance change element is connected to a drain terminal of a selection transistor, wherein a resistance value of the resistance change element changes in response to flowing a current of a predetermined value or larger through the resistance change element; and
a write control unit connected to a connection point between the selection transistor and the resistance change element, wherein the write control unit controls the current flowing through the resistance change element when data is written in the resistance change element, wherein the write control unit is a write control transistor, wherein a gate terminal of the write control transistor is short-circuited to one of a source terminal and a drain terminal of the write control transistor, wherein the one of a source terminal and a drain terminal of the write control transistor is connected to the connection point between the selection transistor and the resistance change element and the other of a source terminal and a drain terminal of the write control transistor is connected to a write control wiring, and wherein the selection transistor and the write control transistor have polarities that are different from each other.

2. The semiconductor storage device according to claim 1, wherein the resistance change element has a stacked structure in which a tunnel insulating film having an insulating property is provided between a fixed layer in which magnetization is fixed in a certain direction and a storage layer in which magnetization is not fixed.

3. The semiconductor storage device according to claim 1, wherein a potential of the bit line connected to the resistance element other than a predetermined resistance change element in which data is to be written is set to a floating potential when the data is written in the resistance change element.

4. The semiconductor storage device according to claim 1, wherein the write control unit is shared by a plurality of selection transistors and resistance change elements arranged in a certain row in a memory array in which memory cells each including the selection transistor, the resistance change element, and the write control unit are arranged in an array.

5. The semiconductor storage device according to claim 1, further comprising:
a read control unit connected to the resistance change element via the write control unit, wherein the read control unit controls the current flowing through the resistance change element when data is read from the resistance change element.

6. A semiconductor storage device, comprising:
at least one or more selection transistors;
a resistance change element, wherein one end of the resistance change element is connected to a bit line and the other end of the resistance change element is connected to a drain terminal of a selection transistor, wherein a resistance value of the resistance change element changes in response to flowing a current of a predetermined value or larger through the resistance change element;
a write control unit connected to a connection point between the selection transistor and the resistance change element, wherein the write control unit controls the current flowing through the resistance change element when data is written in the resistance change element; and a read control unit connected to the resistance change element via the write control unit, wherein the read control unit controls the current flowing through the resistance change element when data is read from the resistance change element.

7. The semiconductor storage device according to claim 6, wherein the write control unit is a write control transistor,
wherein a gate terminal of the write control transistor is short-circuited to one of a source terminal and a drain terminal of the write control transistor,
wherein the one of a source terminal and a drain terminal of the write control transistor is connected to the connection point between the selection transistor and the resistance change element and the other of a source terminal and a drain terminal of the write control transistor is connected to a write control wiring,
wherein the read control unit is a read control transistor,
wherein a gate terminal of the read control transistor is short-circuited to one of a source terminal and a drain terminal of the read control transistor,
wherein the one of a source terminal and a drain terminal of the read control transistor is connected to a connection point between the write control transistor and the write control wiring, and
wherein the other of a source terminal and a drain terminal of the read control transistor is connected to a read control wiring.

8. The semiconductor storage device according to claim 7, wherein the selection transistor and the read control transistor have polarities that are different from each other.

9. The semiconductor storage device according to claim 6, wherein the write control unit and the read control unit are shared by a plurality of selection transistors and resistance change elements arranged in a certain row in a memory array in which memory cells each including the selection transistor, the resistance change element, the write control unit, and the read control unit are arranged in an array.

10. The semiconductor storage device according to claim 6, wherein the resistance change element has a stacked structure in which a tunnel insulating film having an insulating property is provided between a fixed layer in which magnetization is fixed in a certain direction and a storage layer in which magnetization is not fixed.

11. The semiconductor storage device according to claim 6, wherein the write control unit is shared by a plurality of selection transistors and resistance change elements arranged in a certain row in a memory array in which memory cells each including the selection transistor, the resistance change element, and the write control unit are arranged in an array.

12. The semiconductor storage device according to claim 6, wherein a potential of the bit line connected to the resistance element other than a predetermined resistance change element in which data is to be written is set to a floating potential when the data is written in the resistance change element.

13. A semiconductor storage device, comprising:
at least one or more selection transistors;
a resistance change element, wherein one end of the resistance change element is connected to a bit line and the other end of the resistance change element is connected to a drain terminal of a selection transistor, wherein a resistance value of the resistance change element changes in response to flowing a current of a predetermined value or larger through the resistance change element; and
a write control unit connected to a connection point between the selection transistor and the resistance change element, wherein the write control unit controls the current flowing through the resistance change element when data is written in the resistance change element, wherein the write control unit is shared by a plurality of selection transistors and resistance change elements arranged in a certain row in a memory array in which memory cells each including the selection transistor, the resistance change element, and the write control unit are arranged in an array.

14. The semiconductor storage device according to claim 13, wherein the resistance change element has a stacked structure in which a tunnel insulating film having an insulating property is provided between a fixed layer in which magnetization is fixed in a certain direction and a storage layer in which magnetization is not fixed.

15. The semiconductor storage device according to claim 13, wherein a potential of the bit line connected to the resistance element other than a predetermined resistance change element in which data is to be written is set to a floating potential when the data is written in the resistance change element.

16. A driving method of a semiconductor storage device, including:
at least one or more selection transistors;
a resistance change element, wherein one end of the resistance change element is connected to a bit line and the other end of the resistance change element is connected to a drain terminal of a selection transistor, wherein a resistance value of the resistance change element changes in response to flowing a current of a predetermined value or larger through the resistance change element; and
a write control unit connected to a connection point between the selection transistor and the resistance change element, wherein the write control unit controls the current flowing through the resistance change element when data is written in the resistance change element,
wherein the write control unit is a write control transistor, wherein a gate terminal of the write control transistor is short-circuited to one of a source terminal and a drain terminal of the write control transistor,
wherein the one of a source terminal and a drain terminal of the write control transistor is connected to the connection point between the selection transistor and the resistance change element and the other of a source terminal and a drain terminal of the write control transistor is connected to a write control wiring, and
wherein the selection transistor and the write control transistor have polarities that are different from each other,
the driving method comprising:
making a potential of the bit line connected to the resistance change element other than a predetermined resistance change element in which the data is to be written a floating potential when the data is written in the resistance change element.

17. An electronic device, comprising:
a semiconductor storage device including:
at least one or more selection transistors;
a resistance change element wherein one end of the resistance change element is connected to a bit line and the other end of the resistance change element is connected to a drain terminal of a selection transistor, wherein a resistance value of the resistance change element changes in response to flowing a current of a predetermined value or larger through the resistance change element; and a write control unit connected to a connection point between the selection transistor and the resistance change element, wherein the write control unit controls the current flowing through the resistance change element when data is written in the resistance change element.

18. The electronic device according to claim 17, wherein the write control unit is a write control transistor, wherein a gate terminal of the write control transistor is short-circuited to one of a source terminal and a drain terminal of the write control transistor, wherein the one of a source terminal and a drain terminal of the write control transistor is connected to the connection point between the selection transistor and the resistance change element and the other of a source terminal and a drain terminal is connected to a write control wiring, wherein the read control unit is a read control transistor, wherein a gate terminal of the read control transistor is short-circuited to one of a source terminal and a drain terminal of the read control transistor, wherein the one of a source terminal and a drain terminal of the read control transistor is connected to a connection point between the write control transistor and the write control wiring, and wherein the other of a source terminal and a drain terminal of the read control transistor is connected to a read control wiring.

19. The electronic device according to claim 17, wherein the selection transistor and the read control transistor have polarities that are different from each other.

20. The electronic device according to claim 17, wherein the resistance change element has a stacked structure in which a tunnel insulating film having an insulating property is provided between a fixed layer in which magnetization is fixed in a certain direction and a storage layer in which magnetization is not fixed.

* * * * *